US012518911B2

(12) United States Patent
Koike et al.

(10) Patent No.: US 12,518,911 B2
(45) Date of Patent: Jan. 6, 2026

(54) INDUCTOR AND METHOD OF MANUFACTURING INDUCTOR

(71) Applicant: Murata Manufacturing Co., Ltd., Kyoto-fu (JP)

(72) Inventors: Masato Koike, Nagaokakyo (JP); Hiroaki Takashima, Nagaokakyo (JP); Eiji Iso, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 955 days.

(21) Appl. No.: 17/706,094

(22) Filed: Mar. 28, 2022

(65) Prior Publication Data

US 2022/0328240 A1 Oct. 13, 2022

(30) Foreign Application Priority Data

Mar. 30, 2021 (JP) ................................. 2021-058573
Mar. 30, 2021 (JP) ................................. 2021-058574

(51) Int. Cl.
*H01F 27/28* (2006.01)
*H01F 17/00* (2006.01)
*H01F 17/04* (2006.01)
*H01F 27/29* (2006.01)
*H01F 41/02* (2006.01)
*H01F 41/04* (2006.01)

(52) U.S. Cl.
CPC ....... *H01F 27/292* (2013.01); *H01F 17/0013* (2013.01); *H01F 17/04* (2013.01); *H01F 41/0246* (2013.01); *H01F 41/041* (2013.01); *H01F 2017/048* (2013.01)

(58) Field of Classification Search
CPC .... H01F 27/292; H01F 17/0013; H01F 17/04; H01F 41/0246; H01F 41/041; H01F 2017/048; H01F 41/10; H01F 27/255; H01F 27/29; H01F 41/00; H01F 41/02
USPC ........................................ 336/200, 232, 192
See application file for complete search history.

(56) References Cited

U.S. PATENT DOCUMENTS

2018/0033540 A1\* 2/2018 Lee ...................... H01F 41/041
2018/0137965 A1\* 5/2018 Lee ...................... H01F 17/0033
2018/0182538 A1\* 6/2018 Choi ....................... H01F 41/10

(Continued)

FOREIGN PATENT DOCUMENTS

| CN | 110136938 A | 8/2019 |
| CN | 111128505 A | 5/2020 |
| JP | 2010-245473 A | 10/2010 |

(Continued)

*Primary Examiner* — Shawki S Ismail
*Assistant Examiner* — Kazi S Hossain
(74) *Attorney, Agent, or Firm* — Studebaker Brackett PLLC

(57) ABSTRACT

An inductor in which the external electrode is constituted by a conductive resin layer formed on a surface of a core effectively prevents peeling between the core and the external electrode. The inductor includes a core containing magnetic particles and a resin, a conductor embedded in the core, a conductive resin layer disposed on a surface of the core so as to be in contact with an end portion of the conductor exposed from the core, and a plating layer formed on the conductive resin layer. The plating layer is formed so as to extend to the surface of the core beyond a range in which the conductive resin layer is disposed.

4 Claims, 15 Drawing Sheets

(56) References Cited

U.S. PATENT DOCUMENTS

2019/0252113 A1* 8/2019 Ku .................. H01F 41/042
2020/0135371 A1* 4/2020 Tonoyama .............. C22C 38/08

FOREIGN PATENT DOCUMENTS

| | | |
|---|---|---|
| JP | 2020-72183 A | 5/2020 |
| JP | 2022-74828 A | 5/2022 |

* cited by examiner

PRIOR ART

PRIOR ART

INDUCTOR AND METHOD OF MANUFACTURING INDUCTOR

CROSS-REFERENCE TO RELATED APPLICATIONS

This application claims benefit of priority to Japanese Patent Application No. 2021-058574, filed Mar. 30, 2021, to Japanese Patent Application No. 2021-058573, filed Mar. 30, 2021, the entire contents of each are incorporated herein by reference.

BACKGROUND

Technical Field

The present disclosure relates to an inductor and a method of manufacturing the inductor.

Background Art

An inductor is known in which a coil conductor is embedded in a core that is a molded body so that two end portions of the coil conductor are exposed, and two electrodes connected to the respective exposed end portions are provided on a surface of the core, as described, for example, in Japanese Patent Application Laid-Open No. 2010-245473. In such an inductor, for example, a conductive resin is applied to two portions of the surface of the core so as to be connected to the exposed end portions, and a metal such as nickel or tin is plated on the conductive resin to form an external terminal.

SUMMARY

However, for example, in an environmental condition such as an in-vehicle application having a very wide operating temperature range, the occurrence of peeling of an external electrode from the core can be considered as a failure mode of the inductor.

Accordingly, the present disclosure prevents the occurrence of peeling between a core and an external electrode in an inductor in which the external electrode is constituted by a conductive resin layer formed on a surface of the core.

One aspect of the present disclosure is an inductor including a core containing magnetic particles and a resin; a conductor embedded in the core; a conductive resin layer disposed on a surface of the core so as to be in contact with an end portion of the conductor exposed from the core; and a plating layer formed on the conductive resin layer. The plating layer is formed so as to extend to the surface of the core beyond a range in which the conductive resin layer is disposed.

Another aspect of the present disclosure is a method of manufacturing an inductor including a core containing magnetic particles having an insulating layer on a surface of the magnetic particles and a resin, a conductor embedded in the core, a conductive resin layer disposed on the core so as to be in contact with an end portion of the conductor exposed from the core, and a plating layer formed on the conductive resin layer. The method includes a step of removing the insulating layer of the magnetic particles exposed on the surface of the core at a planned electrode location on the surface of the core, the planned electrode location being a range in which an external electrode is to be formed; a resin layer forming step of forming the conductive resin layer within a range of the planned electrode location; and a plating step of forming a plating layer on the conductive resin layer within the range of the planned electrode location. In the plating step, the plating layer being formed so as to extend to the surface of the core beyond a range of the conductive resin layer formed in the resin layer forming step.

According to the present disclosure, in an inductor in which an external electrode is constituted by a conductive resin layer formed on a surface of a core, the occurrence of peeling between the core and the external electrode can be effectively prevented.

DETAILED DESCRIPTION

Hereinafter, embodiments of the present disclosure will be described with reference to the drawings.

First Embodiment

First, a first embodiment of the present disclosure will be described.

Figure 1:
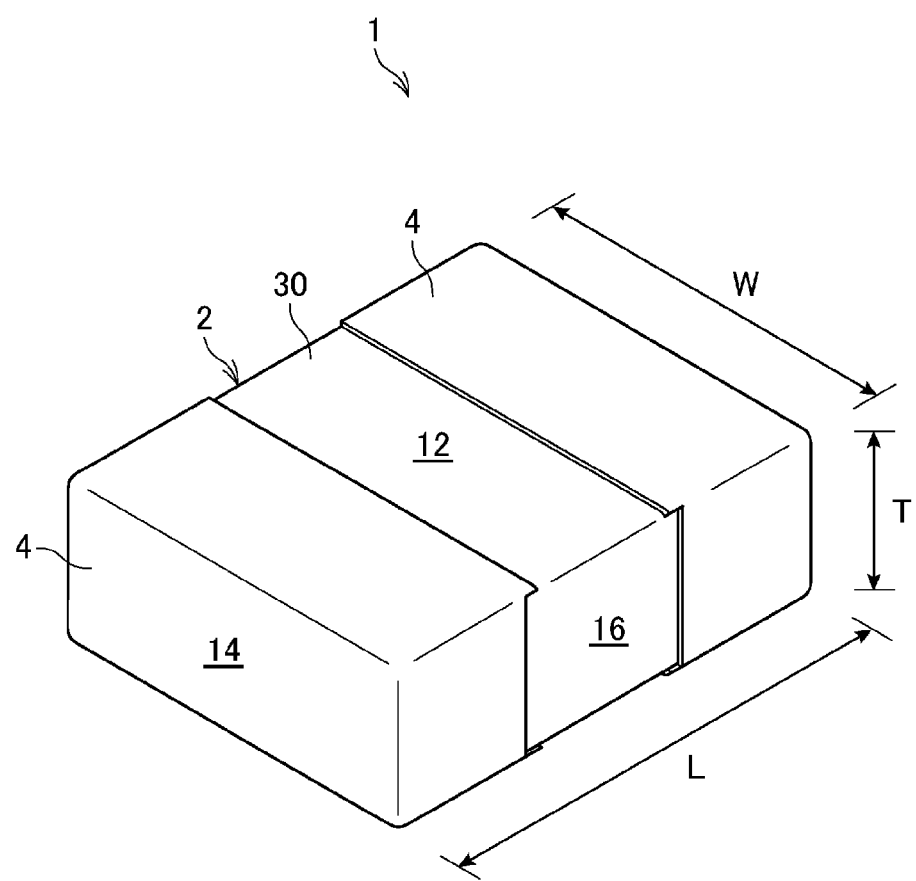
FIG. 1 is a perspective view of an inductor according to a first embodiment of the present disclosure as viewed from an upper surface side.
Figure 2:
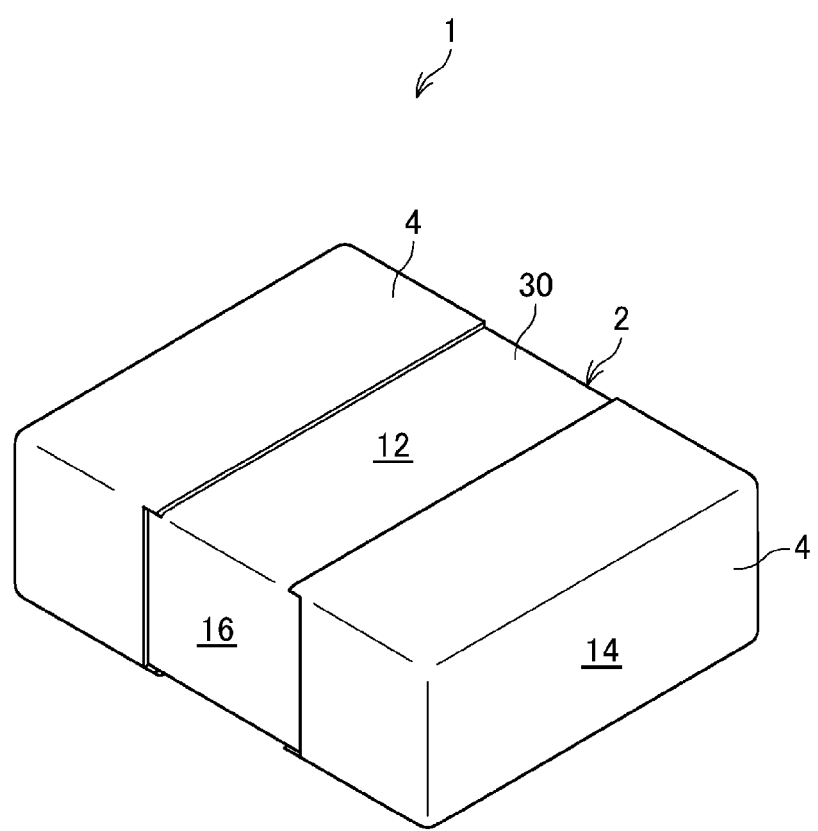
FIG. 2 is a perspective view of the inductor as viewed from a bottom surface side.

FIG. 1 is a perspective view of an inductor 1 according to a first embodiment of the present disclosure as viewed from a side of an upper surface 12, and FIG. 2 is a perspective view of the inductor 1 as viewed from a side of a bottom surface 10 facing the upper surface 12.

The inductor 1 of the present embodiment is configured as a surface mount electronic component, and includes an element body 2 having a substantially rectangular parallelepiped shape, and a pair of external electrodes 4 provided on a surface of the element body 2.

The element body 2 has two opposing surfaces with the external electrodes 4 formed on the entire surface thereof. In the present embodiment, two opposing surfaces on which the external electrode 4 is formed on the entire surface are referred to as end surfaces 14, and two opposing surfaces among four surfaces orthogonal to the end surfaces 14 are referred to as the bottom surface 10 and the upper surface 12. Furthermore, two surfaces orthogonal to the two end surfaces 14, the bottom surface 10, and the upper surface 12 are referred to as side surfaces 16. In the present embodiment, out of the four surfaces other than the end surfaces 14 of the element body 2, one of the two opposing surfaces having a larger area is the bottom surface 10, and the other is the upper surface 12.

As illustrated in FIG. 1, a distance from the bottom surface 10 to the upper surface 12 is defined as a thickness T of the element body 2, a distance between the pair of side surfaces 16 is defined as a width W of the element body 2, and a distance between the pair of end surfaces 14 is defined as a length L of the element body 2. In the present embodiment, for example, the length L, the width W, and the thickness T have a relationship of L>W>T.

Figure 3:
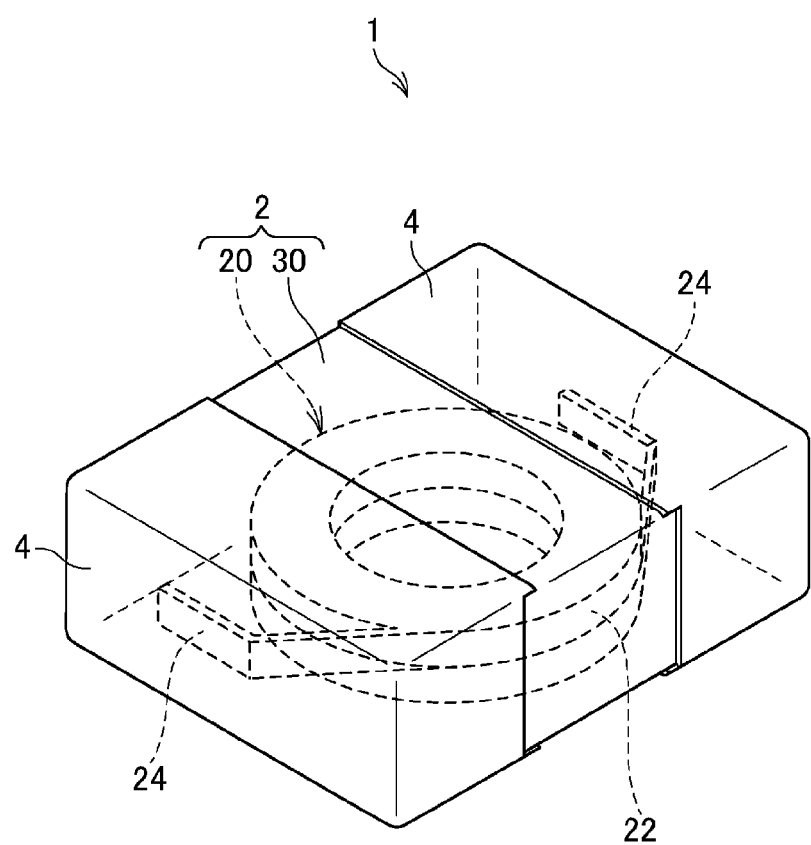
FIG. 3 is a perspective view illustrating an internal configuration of the inductor.

FIG. 3 is a perspective view illustrating an internal configuration of the inductor 1.

The element body 2 includes a coil conductor 20 and a core 30 having a substantially rectangular parallelepiped shape in which the coil conductor 20 is embedded, and is configured as a conductor-sealed magnetic component in which the coil conductor 20 is sealed in the core 30.

The core 30 is a molded body obtained by compression-molding a mixed powder obtained by mixing a magnetic powder and a resin into a substantially rectangular parallelepiped shape by pressurizing and heating the mixed powder while enclosing the coil conductor 20.

In addition, the magnetic powder of the present embodiment includes particles having two types of particle sizes, that is, large first magnetic particles having a relatively large average particle diameter and small second magnetic particles having a relatively small average particle diameter. At the time of compression molding, the small second magnetic particles enter between the large first magnetic particles together with a resin, so that a filling factor of the core 30 can be increased, and a magnetic permeability can also be increased.

Note that the magnetic powder may include particles having an average particle size between the first magnetic particles and the second magnetic particles, thereby including particles having three or more types of particle sizes.

In the present embodiment, both the first magnetic particles and the second magnetic particles are particles, each having a metal particle and an insulating film covering the surface of the metal particle, the metal particle is made of a Fe—Si-based amorphous alloy powder, and the insulating film is made of zinc phosphate. By covering the metal particle with the insulating film, an insulating resistance and a withstand voltage are increased. In the present embodiment, for example, the first magnetic particles and the second magnetic particles are both obtained by coating an amorphous alloy powder of Fe—Cr—Si—B—C with an insulating layer of zinc phosphate. In addition, an average particle diameter (refers to a volume-based median diameter. The same applies hereinafter.) of the first magnetic particles is, for example, 1.4 μm or more and 27.4 μm or less (i.e., from 1.4 μm to 27.4 μm), and an average particle diameter of the second magnetic particles is, for example, 3.75 μm or more and 4.25 μm or less (i.e., from 3.75 μm to 4.25 μm). A thickness of the insulating layer is, for example, 10 nm or more and 50 nm or less (i.e., from 10 nm to 50 nm).

Note that, in the first magnetic particles, Cr-less Fe—C—Si alloy powder, Fe—Ni—Al alloy powder, Fe—Cr—Al alloy powder, Fe—Si—Al alloy powder, Fe—Ni alloy powder, and Fe—Ni—Mo alloy powder may be used as the metal particle. Furthermore, in the second magnetic particles, pure iron such as a carbonyl iron powder may be used as the metal particle.

Further, in the first magnetic particles and the second magnetic particles, another phosphate (magnesium phosphate, calcium phosphate, manganese phosphate, cadmium phosphate, and the like) or a resin material (silicone-based resin, epoxy-based resin, phenol-based resin, polyamide-based resin, polyimide-based resin, polyphenylene sulfide-based resin, and the like) may be used for the insulating film.

In the mixed powder of the present embodiment, an epoxy resin containing a bisphenol A type epoxy resin as a main agent is used as a material of the resin.

Note that the epoxy resin may be a phenol novolak-type epoxy resin.

Furthermore, the material of the resin may be other than the epoxy resin, and may be two or more kinds instead of one kind. For example, as the material of the resin, a thermosetting resin such as a phenol resin, a polyester resin, a polyimide resin, or a polyolefin resin can be used in addition to the epoxy resin.

As illustrated in FIG. 3, the coil conductor 20 includes a winding portion 22 around which a conductive wire is wound, and a pair of extended portions 24 extended from the winding portion 22. The winding portion 22 is formed by spirally winding the conductive wire such that both ends of the conductive wire are located on an outer periphery and connected to each other on an inner periphery. Inside the element body 2, the coil conductor 20 is embedded in the core 30 in an attitude in which a central axis of the winding portion 22 is along a direction of the thickness T of the element body 2, and the extended portion 24 is extended from the winding portion 22 to each of the pair of end surfaces 14 and is electrically connected to the external electrode 4.

The external electrode 4 is a so-called five-sided electrode provided from the entire end surface 14 to a part of each of the bottom surface 10, the upper surface 12, and the pair of side surfaces 16 adjacent to the end surface 14, and is electrically connected to wiring of a circuit board by appropriate mounting means such as solder.

The inductor 1 having such a configuration is used for a step-up/down circuit such as a DC-DC converter, for example, and is used for electronic devices such as a personal computer, a DVD player, a digital camera, a TV, a mobile phone, a smartphone, car electronics, and medical or industrial machines. However, the application of the inductor 1 is not limited thereto, and the inductor 1 can also be used for, for example, a tuning circuit, a filter circuit, a rectifying and smoothing circuit, and the like.

Note that, in the inductor 1, an element-body protective layer may be formed on the entire surface of the element body 2 excluding a range of the external electrode 4. As a material of the element-body protective layer, for example, a thermosetting resin such as an epoxy resin, a polyimide resin, or a phenol resin, or a thermoplastic resin such as a polyethylene resin or a polyamide resin can be used. Note that these resins may further include a filler containing silicon oxide, titanium oxide, or the like.

Figure 4:
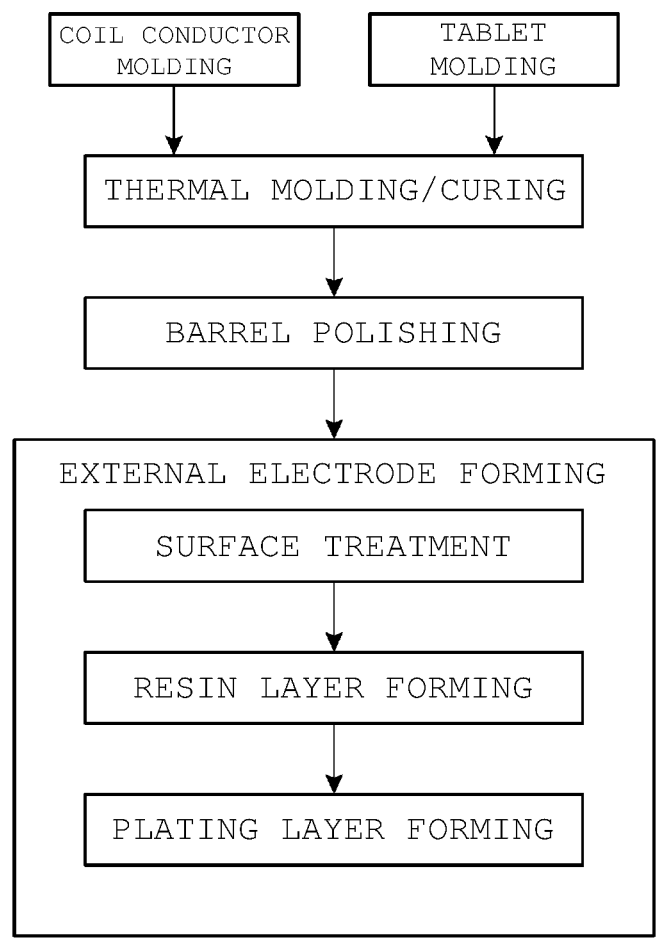
FIG. 4 is a schematic view of a manufacturing process of the inductor.

FIG. 4 is a schematic view of a manufacturing process of the inductor 1.

As illustrated in the drawing, the manufacturing process of the inductor 1 includes a coil conductor molding step, a tablet molding step, a thermal molding/curing step, a barrel polishing step, and an external electrode forming step.

The coil conductor molding step is a step of molding the coil conductor 20 from the conductive wire. In this step, the coil conductor 20 is molded into a shape having the winding portion 22 and the pair of extended portions 24 described above by winding the conductive wire in a winding manner called "alpha winding". The alpha winding refers to a state in which the extended portions 24 at the start and end of winding of the conductive wire functioning as the conductor are spirally wound in two stages so as to be located on the outer periphery. The number of turns of the coil conductor 20 is not particularly limited, and is, for example, 6.5 turns.

The tablet molding step is a step of molding a preformed body called a tablet.

The preformed body is molded into a solid shape that is easy to handle by pressurizing the mixed powder that is the material of the element body 2, and in the present embodiment, two types of tablets including a first tablet having an appropriate shape (for example, an E type or the like) having a groove into which the coil conductor 20 enters, and a second tablet having an appropriate shape (for example, an I type or a plate type or the like) covering the groove of the first tablet are formed.

In the thermal molding/curing step, the first tablet, the coil conductor, and the second tablet are set in a molding die, pressurized in an overlapping direction of the first tablet and the second tablet while heat is applied, and cured to integrate the first tablet, the coil conductor, and the second tablet. As a result, the element body 2 including the coil conductor 20 in the core 30 is molded.

The barrel polishing step is a step of barrel polishing the molded body, and a corner portion of the element body 2 is rounded by the step.

The external electrode forming step is a step of forming the external electrode 4 on the core 30, and includes a surface treatment step, a resin layer forming step, and a plating layer forming step.

The surface treatment step is a step of modifying a surface of a planned electrode location by irradiating the planned electrode location on a surface of the core 30 with a laser beam. Here, the planned electrode location refers to a range of the surface of the core 30 where the external electrode 4 is to be formed, and includes a portion where the extended portion 24 is exposed. Specifically, the insulating layer on the surface of the magnetic particles exposed from the core 30 in the range of the planned electrode location is removed by irradiation with laser light. As a result, a portion of the planned electrode location of the surface of the core 30 has a larger exposed area of the metal of the magnetic particles per unit area of the surface of the core 30 than other surface portions of the core 30. Note that, after the laser irradiation, a cleaning treatment (for example, an etching treatment) for cleaning the surface of the planned electrode location may be performed.

In the resin layer forming step, a conductive resin layer is formed by applying a paste-like conductive resin to the planned electrode location and drying and curing the resin. Specifically, the conductive resin is applied to a desired application range including the end surface 14 by dipping and pulling up the core 30 from a side of the end surface 14 in the conductive resin paste.

Such a conductive resin layer can form a uniform potential distribution at the planned electrode location in a plating step to be described later, so that homogeneity of a plating layer formed on the conductive resin layer can be improved.

In the present embodiment, a mixture of fine powder of silver (Ag) having a particle size of several 10 nm (so-called nanosilver) and an acrylic resin is used as the conductive resin. A weight ratio of silver in the mixture is, for example, 88%. By using such fine powder of silver, in addition to improving the homogeneity of the plating layer described above, the filling rate of silver in the conductive resin layer can be increased to reduce a DC resistance value between the external electrode 4 and the extended portion 24.

In the plating layer forming step, a plating layer is formed on the surface of the conductive resin layer. The plating layer includes a first plating layer directly formed on a surface of the conductive resin layer, and a second plating layer formed on the first plating layer. In the present embodiment, the first plating layer is a nickel (Ni) plating layer, and the second plating layer is a tin (Sn) plating layer. The plating layer can be formed by electrolytic plating (for example, barrel plating). Note that, in the present embodiment, the plating layer is composed of two layers, but is not limited thereto, and can be composed of any number of layers.

Through the external electrode forming step, the external electrode 4 including the conductive resin layer and the plating layer is formed.

In general, in the external electrode formed as described above, the conductive resin layer is formed at the planned electrode location of the core surface, thereby facilitating the growth of plating at the planned electrode location. In addition, due to the fixing strength between the core surface and the conductive resin layer, the external electrode including the conductive resin layer is fixed to the surface of the core.

However, depending on the temperature environmental conditions under which the inductor is used, the fixing strength between the core surface and the conductive resin layer may be insufficient. For example, an electronic component used for an application of an in-vehicle component is required to pass a very severe deterioration acceleration test such as a temperature cycle test changing from −40° C. to 150° C. in order to ensure reliability of operation in a severe vehicle environment (for example, the Automotive Passive Components Test Standard AEC-Q200 REV D (Jun. 1, 2010)).

In such a severe deterioration acceleration test, a phenomenon (delamination) in which the conductive resin layer peels off from the core may be observed.

Figure 5:
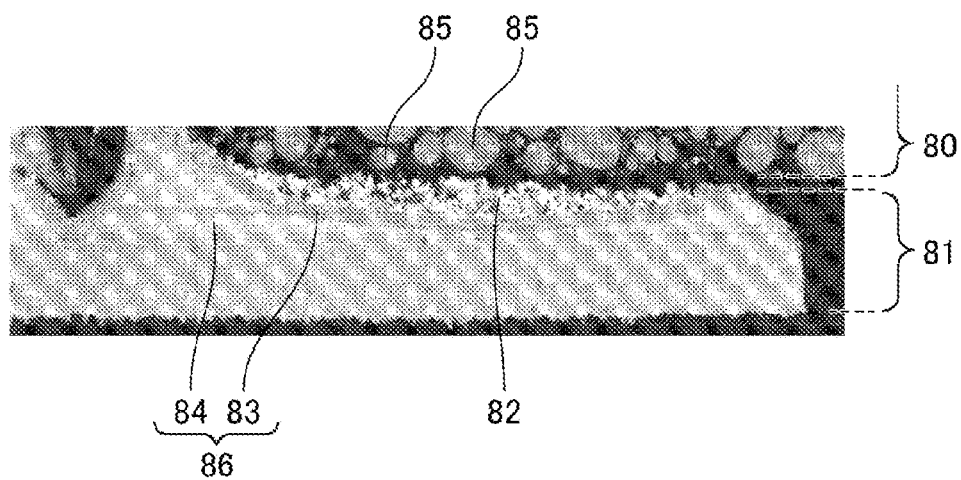
FIG. 5 is an enlarged photograph of a section illustrating a state in which a core and an external electrode are separated from each other in a conventional inductor.
Figure 6:
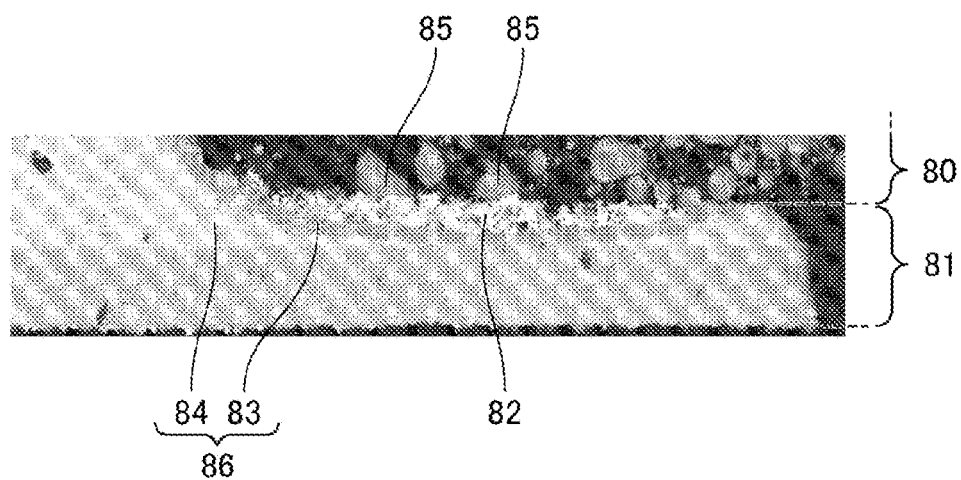
FIG. 6 is an enlarged photograph of a section illustrating a state in which a core and an external electrode are in close contact with each other in a conventional inductor.

FIG. 5 is an enlarged sectional photograph illustrating a peeling state between a core and an external electrode after a temperature cycle test on a bottom surface of the core, which can be observed in a conventional inductor. FIG. 6 is an enlarged sectional photograph illustrating a state of a normal external electrode without peeling on a bottom surface of a core in a conventional inductor for comparison with FIG. 5. In FIGS. 5 and 6, an external electrode 81 includes a conductive resin layer 82 and a plating layer 86.

The plating layer 86 includes a nickel plating layer 83 and a tin plating layer 84. The core 80 includes magnetic particles 85.

In the sectional photograph illustrated in FIG. 6, the magnetic particles 85 constituting the core 80 and the conductive resin layer 82 are in contact with each other, whereas in the sectional photograph illustrated in FIG. 5, it is found that there is no contact portion between the magnetic particles 85 and the conductive resin layer 82, and the core 80 and the conductive resin layer 82 are separated from each other. It is considered that such peeling occurs due to a difference in linear expansion coefficient between the conductive resin layer 82 and the plating layer 86, for example, when an environmental temperature decreases, the plating layer 86 contracts with respect to the conductive resin layer 82, and the conductive resin layer 82 is peeled off from the core 80 by the contracted plating layer 86.

Such peeling of the conductive resin leads not only to a disconnection failure (open failure) between a wiring pattern of the circuit board and the inductor but also to characteristic fluctuation such as inductance fluctuation, and thus effective measures for avoiding such characteristic fluctuation are required.

Figure 7:
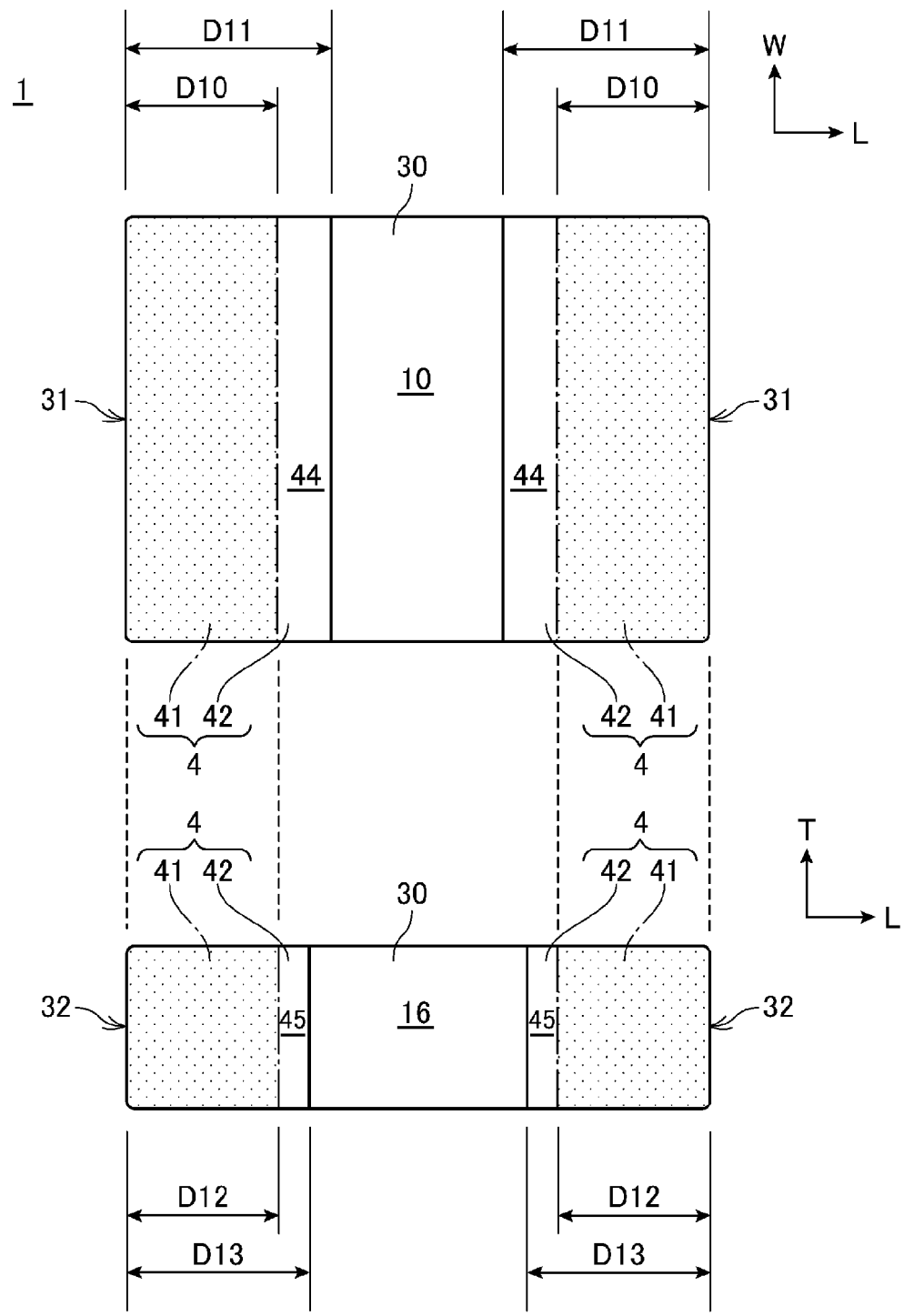
FIG. 7 is a diagram illustrating a positional relationship between a conductive resin layer and a plating layer in the inductor illustrated in FIG. 1.
Figure 8:
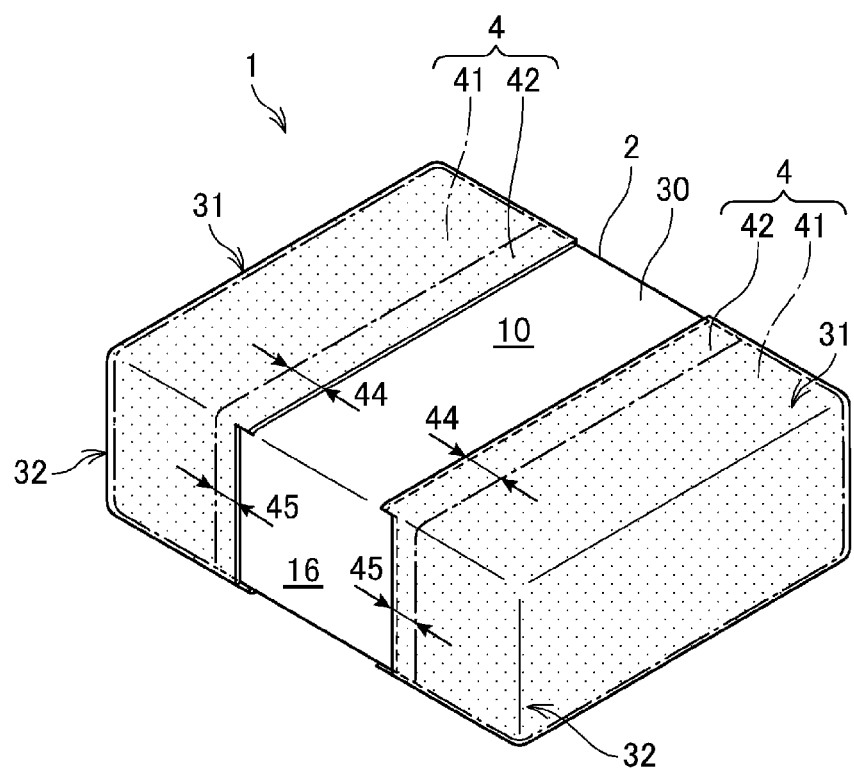
FIG. 8 is a perspective view of the conductive resin layer and the plating layer illustrated in FIG. 7 as viewed from a side of a bottom surface 10.

Therefore, in the inductor 1 of the present embodiment, in particular, the plating layer is formed so as to extend to the surface of the core 30 beyond the range in which the conductive resin layer is disposed. FIG. 7 is a view for explaining a positional relationship between the conductive resin layer and the plating layer, and the upper and lower parts of FIG. 7 are plan views of the bottom surface 10 and the side surface 16 of the inductor 1, respectively. FIG. 8 is a perspective view of the conductive resin layer and the plating layer illustrated in FIG. 7 as viewed from a side of the bottom surface 10. As described above, in the present embodiment, the plating layer includes a nickel plating layer as a first plating layer and a tin plating layer as a second plating layer.

As illustrated in the upper part of FIG. 7 and FIG. 8, the conductive resin layer 41 extends on the bottom surface 10 from two first end portions 31 facing each other in the bottom surface 10 of the core 30 having a substantially rectangular shape. In the present embodiment, the first end portion 31 is a ridge line formed by the bottom surface 10 and the end surface 14. The plating layer 42 is formed so as to extend to the surface of the core 30 beyond the range in which the conductive resin layer 41 is disposed. Thus, the plating layer 42 includes a contact region 44 that covers the edge of the conductive resin layer 41 and is in direct contact with the surface of the core 30.

Similarly, as illustrated in the lower part of FIG. 7 and FIG. 8, the conductive resin layer 41 extends on the side surface 16 from two second end portions 32 facing each other of the side surface 16 of the core 30 forming a substantially rectangular shape. In the present embodiment, the second end portion 32 is a ridge line formed by the side surface 16 and the end surface 14. The plating layer 42 is formed so as to extend to the surface of the core 30 beyond the range in which the conductive resin layer 41 is disposed. Thus, the plating layer 42 includes a contact region 45 that covers the edge of the conductive resin layer 41 and is in direct contact with the surface of the core 30.

The upper surface 12 and the side surface 16 on an opposite side not illustrated in FIG. 7 are also configured similarly to the bottom surface 10 and the side surface 16 illustrated in FIG. 7, respectively.

Here, the plating layer 42 is formed in the range of the planned electrode location, and in the planned electrode range, the insulating layer on the surface of the magnetic particles exposed from the core 30 is removed by laser light irradiation in the above-described surface treatment step. Therefore, in a portion of the surface of the core 30 where the plating layer 42 is formed beyond the range of the conductive resin layer 41, that is, in the contact regions 44 and 45, an exposed area of the metal of the magnetic particles per unit area on the surface of the core 30 is larger than the other portions of the surface of the core 30.

In the inductor 1 having the above configuration, the plating layer 42 is metal-bonded to the magnetic particles exposed on the surface of the core 30 in the contact region 44 and the contact region 45, and is firmly bonded to the core 30. Therefore, in the inductor 1, the fixing strength of the external electrode 4 to the core 30 is increased, and peeling between the external electrode 4 and the core 30 is prevented under severe environmental conditions such as in-vehicle use. Further, in the conventional inductor, the peeling off of the conductive resin layer from the core generally proceeds from the edge portion of the conductive resin layer, whereas in the inductor 1, the contact region 44 and the contact region 45 are formed in the immediate vicinity of the edge portion of the conductive resin layer 41, so that the start of the peeling off of the edge portion of the conductive resin layer 41 from the core 30 can be effectively prevented. As a result, in the inductor 1, peeling between the core 30 and the external electrode 4 can be effectively prevented under severe conditions in in-vehicle applications and the like.

Here, the effect of preventing the peeling of the external electrode 4 from the core 30 can depend on a ratio Rs of an area Sm of the plating layer 42 to an area Sp of the conductive resin layer 41 on each of the bottom surface 10 and the side surface 16. Table 1 illustrates results of evaluating a relationship between the area ratio Rs (=Sm/Sp) and the peeling off preventing effect using a sample for evaluation having the same configuration as the inductor 1 illustrated in FIG. 7. Note that, in Table 1, rows except a title row of an uppermost row are referred to as a first row, a second row, a third row, . . . in order from a top, and are referred to as a first column, a second column, a third column, . . . in order from a leftmost column to the right.

TABLE 1

| Sample number | Size L × W × T (mm) | Mount surface | | | Side surface | | | Withstand voltage determination | Comprehensive determination |
| --- | --- | --- | --- | --- | --- | --- | --- | --- | --- |
| | | Area ratio Rs | Area ratio Sp (mm²) | Peeling occurrence rate | Area ratio Rs | Area ratio Sp (mm²) | Peeling occurrence rate | | |
| 101 | Size I | 100% | 0.4 | 40% | 100% | 0.2 | 0% | G | NG |
| 102 | 3.2 × 2.5 × 1.2 | 114% | 0.4 | 0% | 100% | 0.2 | 0% | G | G |
| 103 | | 120% | 0.4 | 0% | 100% | 0.2 | 0% | G | G |
| 104 | | 540% | 0.4 | 0% | 100% | 0.2 | 0% | G | G |

TABLE 1-continued

| | | Mount surface | | | Side surface | | | | |
|---|---|---|---|---|---|---|---|---|---|
| Sample number | Size L × W × T (mm) | Area ratio Rs | Area ratio Sp (mm²) | Peeling occurrence rate | Area ratio Rs | Area ratio Sp (mm²) | Peeling occurrence rate | Withstand voltage determination | Comprehensive determination |
| 105 | | 550% | 0.4 | 0% | 100% | 0.2 | 0% | G | G |
| 106 | | 600% | 0.4 | 0% | 100% | 0.2 | 0% | NG | NG |
| 107 | Size II | 100% | 0.4 | 40% | 100% | 0.3 | 25% | G | NG |
| 108 | 3.2 × 2.5 × 2.0 | 114% | 0.4 | 0% | 100% | 0.3 | 25% | G | NG |
| 109 | | 114% | 0.4 | 0% | 105% | 0.3 | 0% | G | G |
| 110 | | 114% | 0.4 | 0% | 110% | 0.3 | 0% | G | G |
| 111 | | 120% | 0.4 | 0% | 120% | 0.3 | 0% | G | G |
| 112 | | 540% | 0.4 | 0% | 540% | 0.3 | 0% | G | G |
| 113 | | 114% | 0.4 | 0% | 550% | 0.3 | 0% | G | G |
| 114 | | 114% | 0.4 | 0% | 600% | 0.3 | 0% | NG | NG |
| 115 | | 100% | 1.3 | 90% | 100% | 1.0 | 50% | G | NG |

The first column of Table 1 is the number of the sample, and the second column is the size of the element body 2 (thus, the size of the core 30) of each sample. Samples 101 to 106 are of size I, and samples 107 to 115 are of size II. Both the size I and the size II have a length L of 3.2 mm and a width W of 2.5 mm, such that the size of the bottom surface 10 and the top surface 12 are the same in all samples.

A difference between the size I and the size II is a thickness T, the thickness T of the size I is 1.2 mm, and the thickness of the size II is 2.0 mm That is, the samples 101 to 106 are lower in height relative to the samples 107 to 115, and thus the side surfaces 16 of the samples 101 to 106 are larger and more elongated in aspect ratio (L/T) relative to the samples 107 to 115.

In each of the samples 101 to 106 and the samples 107 to 114, each sample has a different combination of the area ratios Rs of the bottom surface 10 and the side surfaces 16.

For each of the samples 101 to 106 and the samples 107 to 114, the area ratio Rs on the bottom surface 10 and the side surface 16 illustrated in the third column and the sixth column was changed by fixing the area Sp of the conductive resin layer 41 illustrated in the fourth column and the seventh column to a constant value and changing the area Sm of the plating layer 42 for each sample. Specifically, for each sample, on each of the bottom surface 10 and the side surface 16, lengths D10 and D12 of the conductive resin layer 41 along a direction of the length L were fixed to the same length, and lengths D11 and D13 of the plating layer 42 along the direction of the length L were changed (See FIG. 7 for definitions of D10, D11, D12, and D13.).

Here, since the size of the bottom surface 10 is the same (3.2 mm×2.5 mm) and the area Sp of the conductive resin layer 41 on the bottom surface 10 is the same (0.4 mm²) in all the samples, the length D10 of the conductive resin layer 41 on the bottom surface is the same in all the samples. In addition, since the ratio of the thickness T (2.0/1.2) and the ratio of the fixed value of the area Sp (0.3/0.2) of the samples 107 to 114 to the samples 101 to 106 are substantially the same, the length D12 of the conductive resin layer 41 on the side surface 16 is also substantially the same in all the samples.

Note that the area ratio Rs=100% in the third column and the sixth column in Table 1 indicates a state in which there are no contact regions 44 and 45 on the bottom surface 10 and the side surface 16, respectively, that is, a state in which the surface of the core 30 other than the portion where the conductive resin layer 41 is formed is not modified at the planned electrode location by the laser beam irradiation, and the plating layer 42 is formed in substantially the same range as the conductive resin layer 41.

For each sample, a temperature cycle test was performed, each sample after a temperature cycle was cut at a surface parallel to the side surface 16 and a surface parallel to the bottom surface 10, and the cut surface was observed with a microscope to determine whether the conductive resin layer 41 was peeled off from the core 30 on the bottom surface 10 and the side surface 16. The results are illustrated in the fifth and eighth columns of Table 1. From the 120 samples prepared, 10 samples having a predetermined area ratio were selected, and a ratio of the number of samples in which peeling was observed to the total number of samples for each of the bottom surface 10 and the side surface 16 was taken as a peeling occurrence rate (unit %).

As conditions of the temperature cycle test, according to the above-described Automotive Passive Components Test Standard, 2000 temperature cycles were performed in which each sample was placed in an oven tank and the temperature in the tank was held at a low temperature of −40° C. and a high temperature of 150° C. for 30 minutes each. The transition time of the temperature in the tank between the low temperature and the high temperature is 2 minutes.

Withstand voltage determination of the ninth column is an evaluation result of the withstand voltage between the external electrodes 4 facing each other in the element body 2, and a case where the withstand voltage is 40 V or more is referred to as "G (good)", and a case where the withstand voltage is less than 40 V is referred to as "NG (poor)". In either the bottom surface 10 or the side surface 16, when the area ratio Rs increases, D10 or D12 increases and the distance between the external electrodes 4 facing each other decreases, so that the withstand voltage decreases.

Comprehensive determination of the tenth column was "G (good)" when the peeling occurrence rate at both the bottom surface 10 and the side surface 16 was 0% and the withstand voltage determination was "G", and was "NG (defective)" otherwise.

From the evaluation results of the bottom surface 10 illustrated in the third to fifth columns of Table 1, the withstand voltage determination of the ninth column, and the comprehensive determination of the tenth column, it is found that the area ratio Rs is preferably 114% or more and 550% or less (i.e., from 114% to 550%) on the bottom surface 10, and by setting the area ratio Rs to a value in this range, peeling of the external electrode 4 from the core 30 can be suppressed while the withstand voltage is maintained at a predetermined value of 40 V.

That is, from the viewpoint of effectively preventing the peeling, in the bottom surface 10, for each of the conductive resin layers 41 extending from the two first end portions 31, the ratio of the area Sm of the plating layer 42 covering the conductive resin layer 41 to the area Sp of the conductive resin layer 41 is preferably 114% or more and 550% or less (i.e., from 114% to 550%).

Regarding the side surface 16, according to the evaluation results illustrated in the sixth to eighth columns of Table 1, in the low height samples 101 to 106 having a thickness of 1.2 mm, peeling of the external electrode 4 from the core 30 did not occur at an area ratio of 100%. On the other hand, in the samples 107 to 114 having a thickness of 2.0 mm, dependency of the peeling occurrence rate on the area ratio Rs is recognized. From the evaluation results of the sixth to eighth columns, the withstand voltage determination of the ninth row, and the comprehensive determination of the tenth column in Table 1 for the samples 107 to 114, it is found that the area ratio Rs is preferably 105% or more and 550% or less (i.e., from 105% to 550%) for the side surface 16.

In general, when the area ratio Rs is 100% (therefore, when the plating layer 42 is formed in substantially the same range as the conductive resin layer 41), the stress applied from the plating layer 42 to the conductive resin layer 41 is smaller as an area (therefore, the area Sp of the conductive resin layer 41) where the conductive resin layer 41 and the plating layer 42 overlap is smaller. Therefore, in the samples 101 to 106 in which the thickness T of the element body 2 was as low as 1.2 mm and the area of the conductive resin layer 41 formed on the side surface 16 was small, it is considered that the external electrode 4 was not peeled from the core 30 when the area ratio Rs was 100%.

Similarly, in the sample 115 illustrated in the lowermost row of Table 1, it is considered that the peeling occurrence rate on the bottom surface 10 and the side surface 16 is larger than that of other samples because the area Sp where the conductive resin layer 41 and the plating layer 42 overlap on the bottom surface 10 and the side surface 16 is larger than that of other samples.

As a conclusion, from the results in Table 1, it is found that, for the side surface 16, when the thickness T of the element body 2 is a value large enough to cause peeling of the external electrode 4 at the area ratio Rs=100%, by setting the area ratio Rs to 105% or more and 550% or less (i.e., from 105% to 550%), peeling of the external electrode 4 from the core 30 can be suppressed while the withstand voltage is maintained at the predetermined value of 40 V.

That is, from the viewpoint of effectively preventing the peeling of the external electrode 4 from the core 30, in the side surface 16, for each of the conductive resin layers 41 extending from the two second end portions 32, the ratio of the area Sm of the plating layer 42 covering the conductive resin layer 41 to the area Sp of the conductive resin layer 41 is preferably 105% or more and 550% or less (i.e., from 105% to 550%).

Note that, in the side surface 16, the range of the thickness T of the element body 2 in which the external electrode 4 can be peeled off from the core 30 when the area ratio Rs is 100% can depend on the fixing strength of the conductive resin layer 41 to the surface of the core 30. Further, it is considered that the fixing strength of the conductive resin layer 41 to the surface of the core 30 depends on the material of the conductive resin layer 41.

In the inductor 1 of the present embodiment, for example, as the sizes of the element body 2, L is 3.2 mm, W is 3.5 mm, and T is 2.0 mm, and based on the evaluation results in Table 1, the area ratio Rs on the bottom surface 10 is 160%, and the area ratio Rs on the side surface is 128%. Furthermore, in the inductor 1, as illustrated in FIG. 7, the length D10 of the plating layer 42 extending from the first end portion 31 to the bottom surface 10, and the length D12 extending from the second end portion 32 to the side surface 16 are the same.

Note that, in the inductor 1 described above, the plating layer 42 is formed such that the area ratio Rs on the bottom surface 10 is different from the area ratio Rs on the side surface 16, but the configuration of the plating layer 42 is not limited thereto. The area ratio Rs on the bottom surface 10 and the area ratio Rs on the side surface 16 may be the same value as long as they fall within the above-described preferable value range.

Further, in the inductor 1, the length D10 of the conductive resin layer 41 extending from the first end portion 31 to the bottom surface 10, and the length D12 extending from the second end portion 32 to the side surface 16 are the same, but the lengths D10 and D12 may be different. However, since the conductive resin layer 41 in which D10 and D12 have the same length can be easily formed by dipping the core 30 in the conductive resin paste, the manufacturing process becomes easy.

Next, modification examples of the inductor 1 according to the present embodiment will be described.

First Modification Example

As illustrated in FIG. 7, in the inductor 1, in the plating layer 42, the length D11 extending from the first end portion 31 to the bottom surface 10, and the length D13 extending from the second end portion 32 to the side surface 16 are different from each other. However, this is an example, and the plating layer 42 may be formed such that D11 and D13 have the same length.

An inductor 1-1 according to the first modification example of the inductor 1 is an example in which the lengths D11 and D13 in which the plating layer 42 extends on the bottom surface 10 and the side surface 16 are the same as each other.

Figure 9:
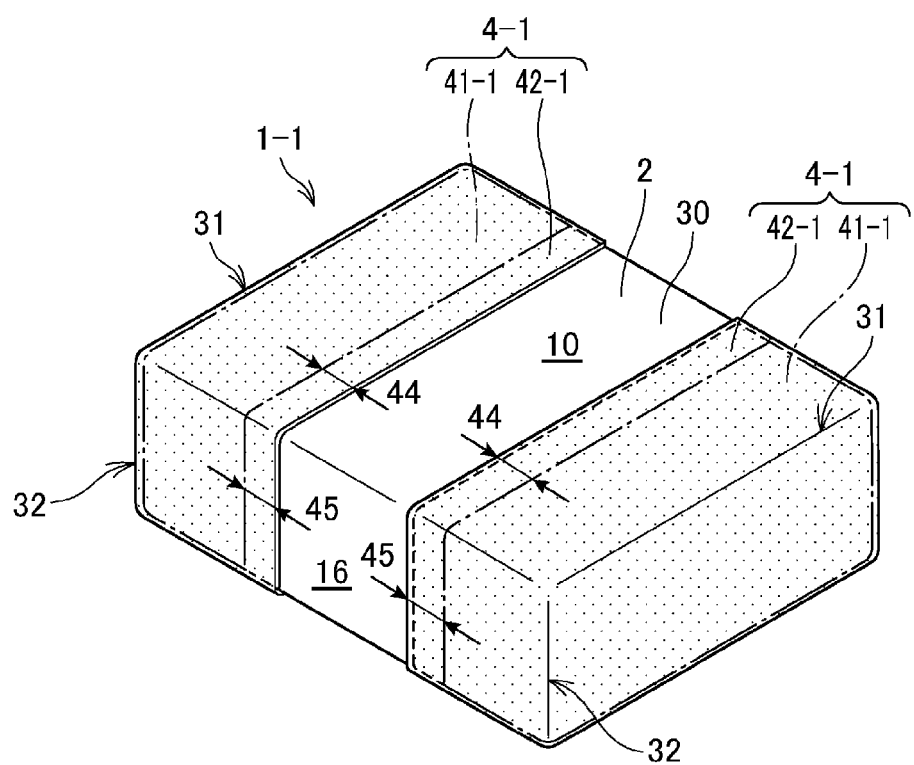
FIG. 9 is a perspective view of a conductive resin layer and a plating layer of an inductor according to a first modification example as viewed from a bottom surface side.
Figure 10:
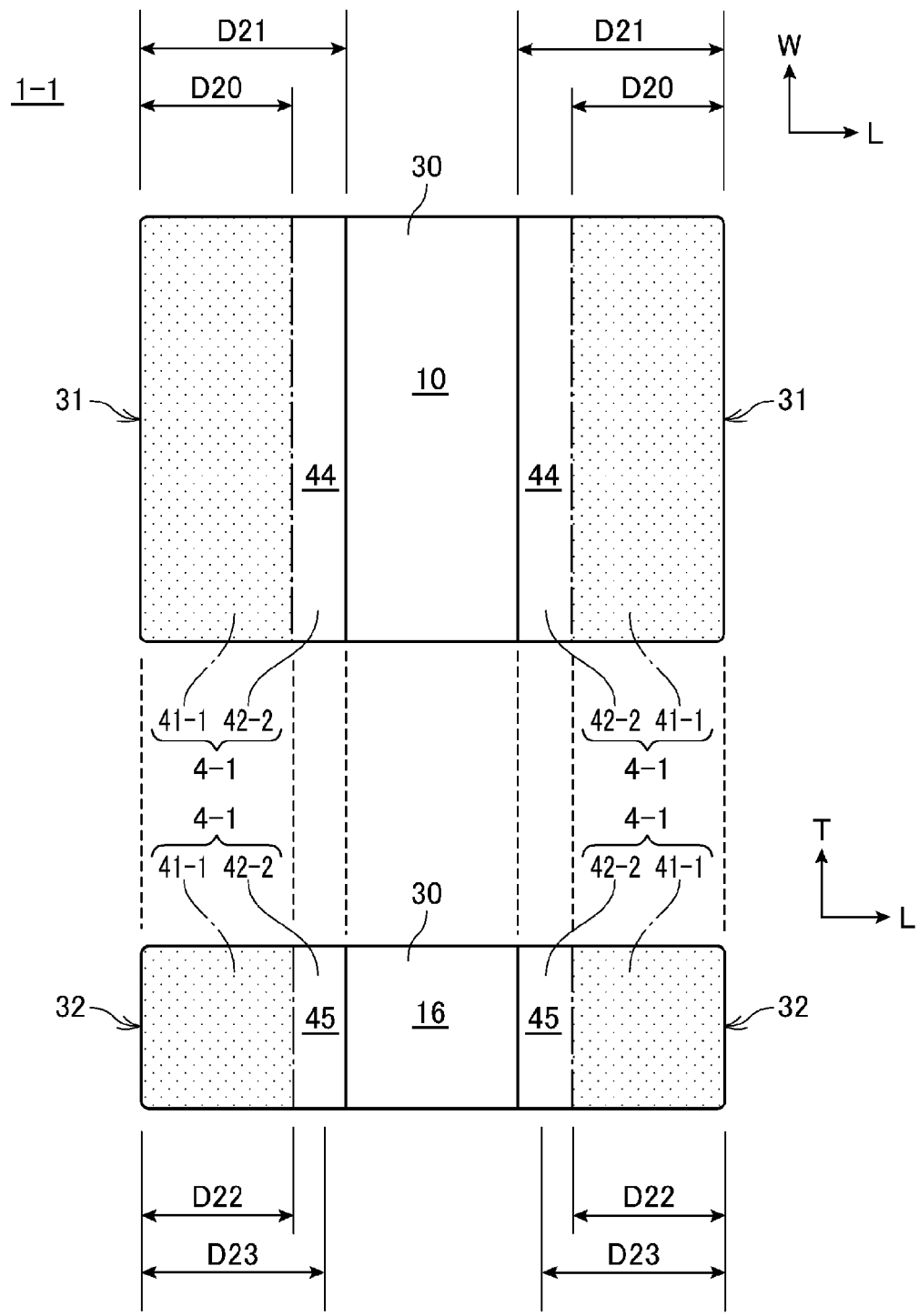
FIG. 10 is a diagram illustrating a positional relationship between the conductive resin layer and the plating layer in the inductor illustrated in FIG. 9.

FIG. 9 is a perspective view of the inductor 1-1 as viewed from a side of the bottom surface 10, and is a view corresponding to FIG. 8 for the inductor 1. Further, FIG. 10 is a view corresponding to FIG. 7 for the inductor 1, and the upper and lower parts of FIG. 10 are plan views of the bottom surface 10 and the side surface 16 of the inductor 1-1, respectively. The upper surface 12 and the opposite side surface 16 not illustrated in FIG. 10 are also configured similarly to the bottom surface 10 and the side surface 16 illustrated in FIG. 10, respectively. Note that, in FIGS. 9 and 10, the same reference signs as those in FIGS. 8 and 7 are used for the same components as those in FIGS. 8 and 7, and the description of FIGS. 8 and 7 described above is incorporated.

The inductor 1-1 has the same configuration as the inductor 1, but is different in that an external electrode 4-1 including a conductive resin layer 41-1 and a plating layer 42-1 is provided instead of the external electrode 4. The conductive resin layer 41-1 and the plating layer 42-1 have the same configuration as the conductive resin layer 41 and the plating layer 42, but have different shapes.

Specifically, a length D21 of the plating layer 42-1 extending from the first end portion 31 to the bottom surface 10 is equal to a length D23 extending from the second end portion 32 to the side surface 16. Furthermore, a length D20 of the conductive resin layer 41-1 extending from the first end portion 31 to the bottom surface 10, and a length D22 extending from the second end portion 32 to the side surface 16 are also the same. As a result, the inductor 1-1 is configured such that the area ratio Rs on the bottom surface 10 and the area ratio Rs on the side surface 16 have the same value within the above-described preferable value range. In the present modification example, for example, the area ratio Rs on the bottom surface 10 and the area ratio Rs on the side surface 16 are both 125%.

In the present modification example, since the plating layer 42-1 is formed in the same length range from the first end portion 31 and the second end portion 32 on the bottom surface 10 and the side surface 16, the shape of the planned electrode location to be determined by irradiating the core 30 with laser in the above-described surface treatment step is simplified. As a result, in the present modification example, the laser irradiation operation in the surface treatment step becomes easy.

Note that, in the present modification example, if the length D20 of the conductive resin layer 41-1 extending from the first end portion 31 to the bottom surface 10, and the length D22 extending from the second end portion 32 to the side surface 16 are made different, the area ratio Rs on the bottom surface 10 and the area ratio Rs on the side surface 16 can be made different.

Second Modification Example

Figure 11:
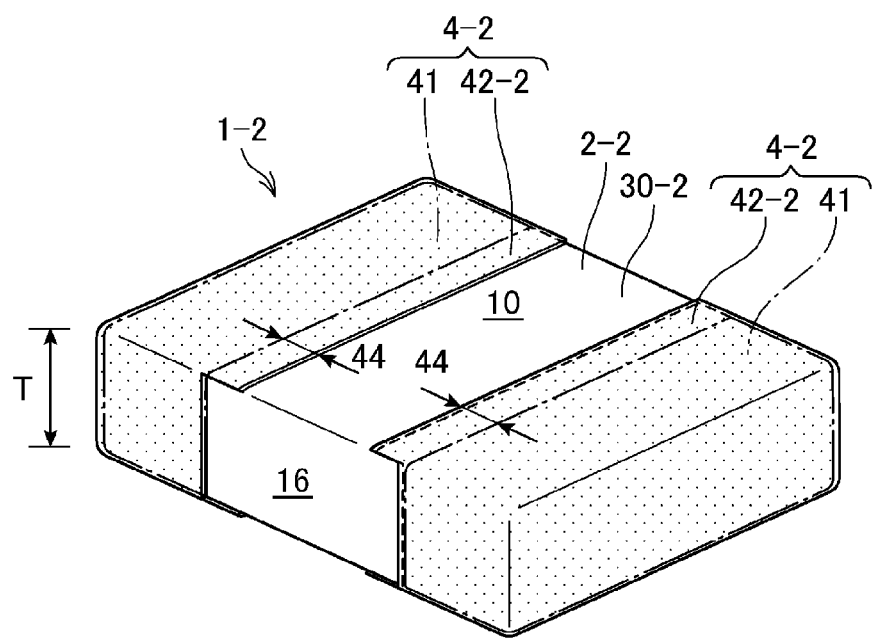
FIG. 11 is a perspective view of a conductive resin layer and a first plating layer of an inductor according to a second modification example as viewed from a bottom surface side.
Figure 12:
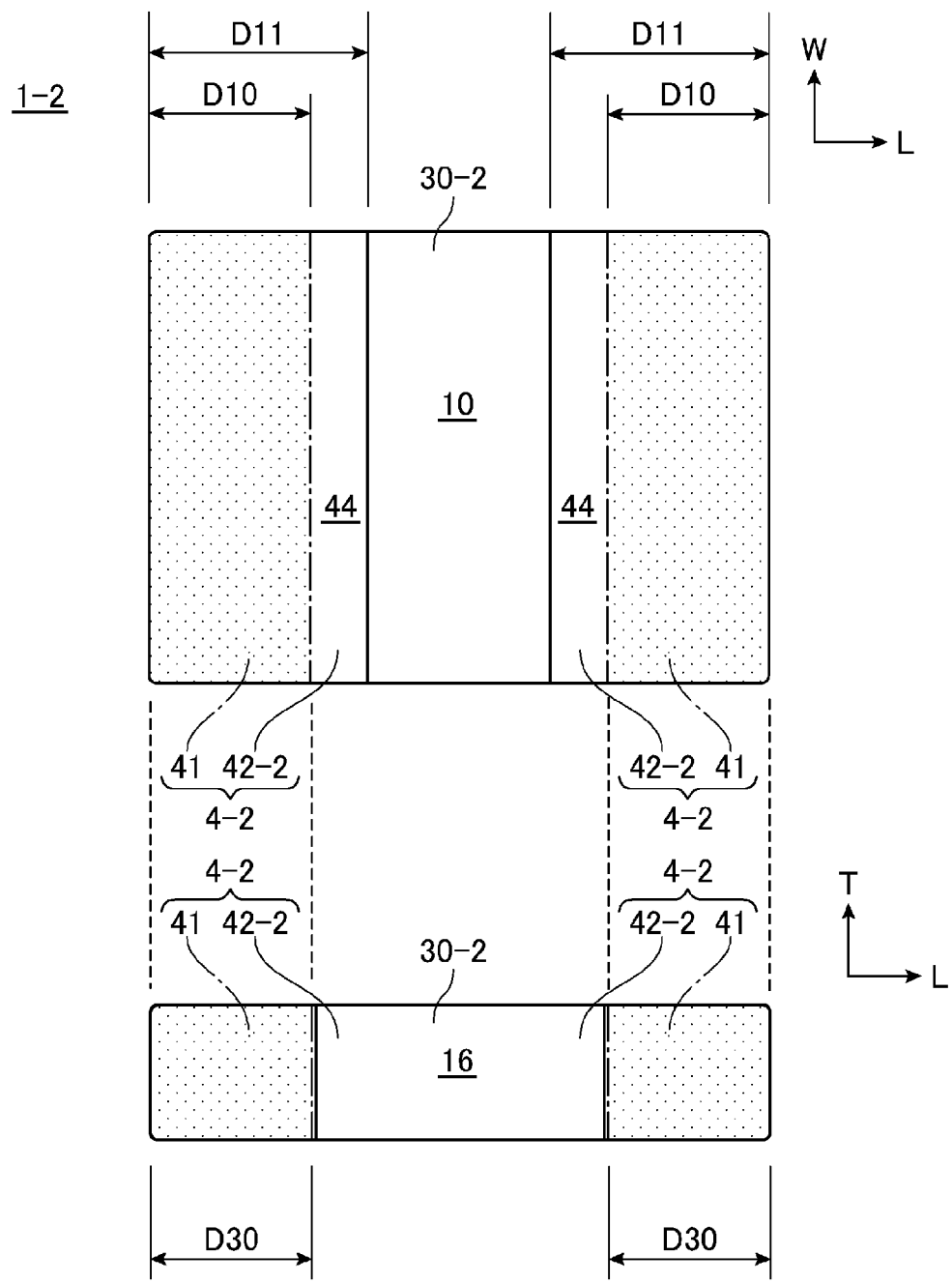
FIG. 12 is a diagram illustrating a positional relationship between the conductive resin layer and the plating layer in the inductor illustrated in FIG. 11.

An inductor 1-2 according to the second modification example of the inductor 1 is an example in which the thickness T of the element body 2 is 1.2 mm and the area ratio Rs on the side surface 16 is 100% in the inductor 1. FIGS. 11 and 12 are diagrams illustrating a configuration of the inductor 1-2. FIG. 11 is a perspective view of the inductor 1-2 as viewed from a side of the bottom surface 10, and is a view corresponding to FIG. 8 for the inductor 1. Further, FIG. 12 is a view corresponding to FIG. 7 for the inductor 1, and the upper and lower parts of FIG. 12 are plan views of the bottom surface 10 and the side surface 16 of the inductor 1-2, respectively. The upper surface 12 and the opposite side surface 16 not illustrated in FIG. 12 are also configured similarly to the bottom surface 10 and the side surface 16 illustrated in FIG. 12, respectively. Note that, in FIGS. 11 and 12, the same components as those in FIGS. 8 and 7 are denoted by the same reference signs as those in FIGS. 8 and 7, and the description of FIGS. 8 and 7 described above is incorporated.

The inductor 1-2 illustrated in FIGS. 11 and 12 has the same configuration as the inductor 1 described above, but includes an element body 2-2 including a core 30-2 instead of the element body 2 including the core 30. The core 30-2 has the same configuration as the core 30, but is different in that the thickness T of the core 30-2 is 1.2 mm Thus, the inductor 1-2 is configured to be lower in height than the inductor 1. Furthermore, the inductor 1-2 is different from the inductor 1 in that an external electrode 4-2 including the conductive resin layer 41 and a plating layer 42-2 is provided instead of the external electrode 4.

The plating layer 42-2 has the same configuration as the plating layer 42, but has a different shape. Specifically, on the side surface 16, the length of the plating layer 42-2 extending from the second end portion 32 and the length of the conductive resin layer 41 are the same length D30. Thus, the inductor 1-2 is configured such that the area ratio Rs on the side surface 16 is 100%. Note that, in FIG. 12, D10=D30, and the area ratio Rs at the bottom surface 10 is 128%, which is the same as that of the inductor 1.

In the inductor 1-2 according to the present modification example, since the area ratio Rs in the bottom surface 10 is a value (120%) within the range of 114% or more and 550% or less (i.e., from 114% to 550%) of the preferable value described with reference to Table 1, the peeling of the external electrode 4 from the core 30 in the bottom surface 10 can be effectively prevented. In addition, since the thickness T of the element body 2-2 (core 30-2) is as low as 1.2 mm, as described with reference to Table 1, when the area ratio Rs on the side surface 16 is 100%, peeling of the external electrode 4 on the side surface 16 is kept to be unlikely to occur.

As a result, in the inductor 1-2, as with the inductor 1, peeling between the core 30 and the external electrode 4 can be effectively prevented under severe conditions in in-vehicle applications and the like.

Second Embodiment

Next, a second embodiment of the present disclosure will be described.

Figure 13:
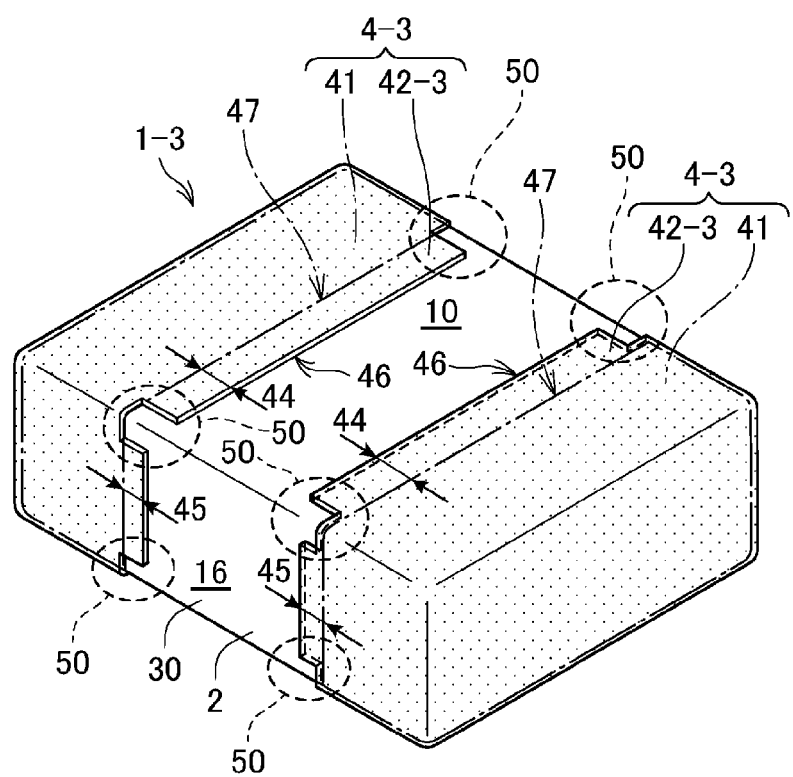
FIG. 13 is a perspective view of a conductive resin layer and a plating layer of an inductor according to a second embodiment of the present disclosure as viewed from a bottom surface side.
Figure 14:
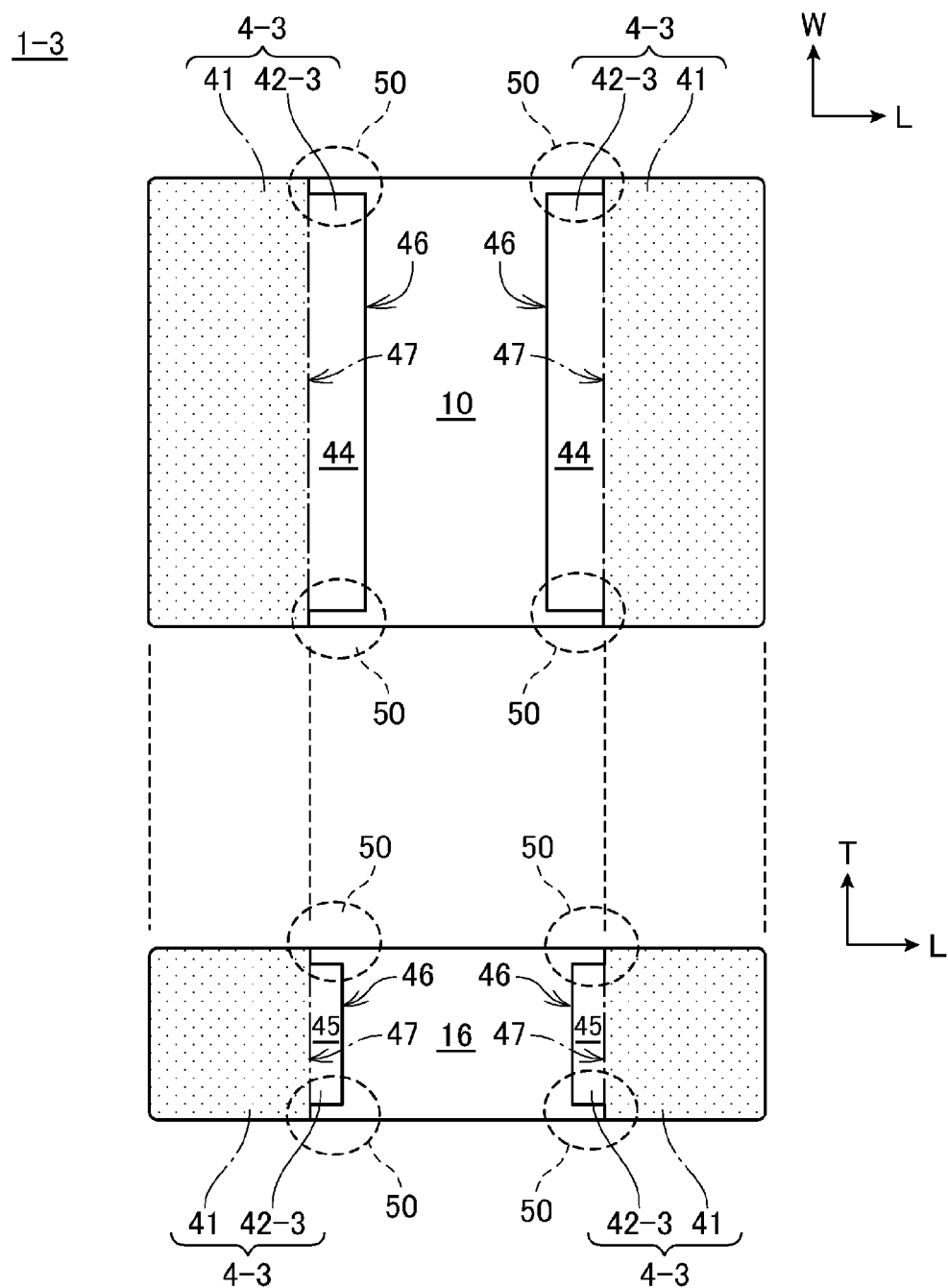
FIG. 14 is a diagram illustrating a positional relationship between the conductive resin layer and the plating layer in the inductor illustrated in FIG. 13.

FIGS. 13 and 14 are diagrams illustrating a configuration of an inductor 1-3 according to the second embodiment. FIG. 13 is a perspective view of the inductor 1-3 as viewed from the side of the bottom surface 10, and is a view corresponding to FIG. 8 for the inductor 1 according to the first embodiment. Further, FIG. 14 is a view corresponding to FIG. 7 for the inductor 1 according to the first embodiment, and the upper and lower parts of FIG. 14 are plan views of the bottom surface 10 and the side surface 16 of the inductor 1-3, respectively. The upper surface 12 and the opposite side surface 16 not illustrated in FIG. 14 are also configured similarly to the bottom surface 10 and the side surface 16 illustrated in FIG. 14, respectively. Note that, in FIGS. 13 and 14, the same components as those in FIGS. 8 and 7 are denoted by the same reference signs as those in FIGS. 8 and 7, and the description of FIGS. 8 and 7 will be cited.

The inductor 1-3 has the same configuration as the inductor 1 according to the first embodiment, but is different in that an external electrode 4-3 including the conductive resin layer 41 and a plating layer 42-3 is provided instead of the external electrode 4. The plating layer 42-3 has the same configuration as the plating layer 42, but has a different shape.

Specifically, similarly to the plating layer 42, the plating layer 42-3 is formed so as to extend to the surface of the core 30 beyond the range in which the conductive resin layer 41 is disposed. However, in the inductor 1-3, as described above, a part of the outer edge 46 of the plating layer 42-3 extending to the surface of the core 30 beyond the formation range of the conductive resin layer 41 forms a recess portion 50 (a portion indicated by a dotted ellipse in the drawing) that is retracted to a position of an edge portion 47 of the conductive resin layer 41 to expose the surface of the core 30.

In the present embodiment, the recess portion 50 is formed on a ridge portion formed by the bottom surface 10 and the upper surface 12 of the element body 2 and the side surface 16.

In the inductor 1-3, as described above, since the plating layer 42-3 is formed so as to extend to the surface of the core 30 beyond the range in which the conductive resin layer 41 is disposed except for the recess portion 50, it is possible to effectively prevent peeling between the core 30 and the external electrode 4 under severe conditions in in-vehicle applications and the like, similarly to the inductor 1.

As described above with reference to Table 1, the stress applied from the plating layer to the conductive resin layer depends on the area where the conductive resin layer and the plating layer overlap. Therefore, also in the inductor 1-3, similarly to the inductor 1 according to the first embodiment, in order to suppress peeling of the external electrode 4-3 from the core 30, the area ratio Rs is preferably 114% or more and 550% or less (i.e., from 114% to 550%) on the bottom surface 10, and the area ratio Rs is preferably 105% or more and 550% or less (i.e., from 105% to 550%) on the side surface 16 from the evaluation results illustrated in Table 1.

In addition, in the inductor 1-3, a part of the outer edge 46 of the plating layer 42-3 recedes to a position of the edge portion 47 of the conductive resin layer 41 to form the recess portion 50 that exposes the surface of the core 30. Therefore, in the inductor 1-3, since the position of the edge portion 47 of the conductive resin layer 41 can be known from a position of the outer edge 46 of the plating layer 42-3 in the recess portion 50, it is possible to easily measure the length of the plating layer 42-3 extending from the edge portion 47 of the conductive resin layer 41 toward the surface of the core 30 using this position as a reference at the time of manufacturing the inductor 1-3. Therefore, in the inductor 1-3, it is possible to easily inspect whether or not the area ratio Rs of the bottom surface 10 and the side surface 16 is within the range of the standard value determined from the design, and to maintain stable manufacturing quality.

Here, the recess portion 50 can be formed, for example, in the surface treatment step of the external electrode forming step described above, by making the shape of the planned electrode location on the surface of the core 30 irradiated with the laser light the same as the shape of the plating layer 42-3 illustrated in FIG. 14. In the resin layer forming step subsequent to the surface treatment step, the core 30 is dipped into the conductive resin paste from the end surface 14 to the position of the recess portion 50 in the range of the surface of the core 30 irradiated with the laser beam, and the conductive resin layer 41 is applied.

Note that, in the present embodiment, the recess portion 50 is formed on the ridge portion formed by the bottom surface 10, the upper surface 12, and the side surface 16, but the position of the recess portion 50 is not limited thereto, and may be provided at an arbitrary position.

Figure 15:
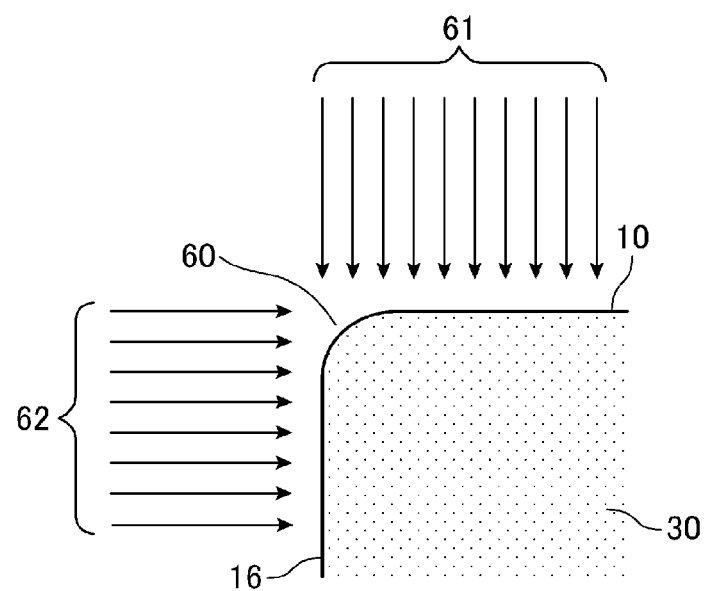
FIG. 15 is a diagram illustrating an example of laser light irradiation in a surface treatment step at a rounded ridgeline.

However, if the recess portion 50 is provided in the ridge portion as in the present embodiment, it is not necessary to irradiate the ridge portion with the laser beam in the surface treatment step in the external electrode forming step described above, so that the surface treatment of the planned electrode location by the laser beam irradiation is facilitated. For example, when the ridge portion formed by the bottom surface 10 and the side surface 16 is rounded by the barrel polishing step, as illustrated in FIG. 15, a rounded ridge portion 60 is irradiated with a laser beam 61 to the bottom surface 10 and a laser beam 62 to the side surface 16 in an overlapping manner, which complicates management of a laser irradiation amount at the ridge portion. On the other hand, when the recess portion 50 is provided at the position of the ridge portion as in the present embodiment, it is not necessary to irradiate the ridge portion at the position of the recess portion 50 with the laser beam, so that the management of the laser irradiation amount in the surface treatment step is simplified.

As described above, the inductor 1 according to the above-described embodiment includes the core 30 containing magnetic particles and a resin, the coil conductor 20 embedded in the core 30, the conductive resin layer 41 disposed on the surface of the core 30 so as to be in contact with the extended portion 24 which is the end portion of the coil conductor 20 exposed from the core 30, and the plating layer 42 formed on the conductive resin layer 41. The plating layer 42 is formed so as to extend to the surface of the core 30 beyond the range in which the conductive resin layer 41 is disposed. According to this configuration, peeling between the core 30 and the external electrode 4 can be effectively prevented under severe conditions in in-vehicle applications and the like.

Furthermore, in the inductor 1, the portion of the surface of the core 30 where the plating layer 42 is formed beyond the range of the conductive resin layer 41 has a larger exposed area of the metal of the magnetic particles per unit area on the surface of the core 30 than the other portions of the surface of the core 30. According to this configuration, a metal bond is formed between the plating layer 42 extending on the surface of the core 30 and the magnetic particles on the surface of the core 30, and peeling between the core 30 and the external electrode 4 can be more effectively prevented.

Further, in the inductor 1, the core 30 is a substantially rectangular parallelepiped, and the conductive resin layer 41 extends on the bottom surface 10 from the two first end portions 31 facing each other of the substantially rectangular bottom surface 10 of the core 30. In each of the conductive resin layers 41 extending from the first end portions 31, the ratio Rs of the area Sm of the plating layer 42 covering the conductive resin layer 41 to the area Sp of the conductive resin layer 41 on the bottom surface 10 is 114% or more and 550% or less (i.e., from 114% to 550%). According to this configuration, peeling of the external electrode 4 from the core 30 can be more reliably prevented on the bottom surface 10.

Furthermore, in the inductor 1, the core 30 is a substantially rectangular parallelepiped, and the conductive resin layer 41 extends on the side surface 16 from the two second end portions 32 facing each other on the side surface 16 in the thickness T direction forming a substantially rectangular shape of the core 30. In each of the conductive resin layers 41 extending from the second end portions 32, the ratio Rs of the area Sm of the plating layer 42 covering the conductive resin layer 41 to the area Sp of the conductive resin layer 41 on the side surface 16 is 105% or more and 550% or less (i.e., from 105% to 550%). According to this configuration, peeling of the external electrode 4 from the core 30 can be more reliably prevented on the side surface 16.

In addition, the manufacturing method according to the above-described embodiment is a manufacturing method of the inductor 1 including the core 30 including the magnetic particles having the insulating layer on the surface and the resin, the coil conductor 20 embedded in the core 30, the conductive resin layer 41 disposed on the core 30 so as to be in contact with the extended portion 24 which is the end portion of the coil conductor 20 exposed from the core 30, and the plating layer 42 formed on the conductive resin layer 41. This manufacturing method includes a surface treatment step of removing the insulating layer of magnetic particles exposed on the surface of the core 30 at the planned electrode location, which is a range where the external electrode 4 is to be formed, on the surface of the core 30, a resin layer forming step of forming a conductive resin layer within a range of the planned electrode location, and a plating step of forming a plating layer on the conductive resin layer within the range of the planned electrode location. Then, in the plating step, the plating layer 42 is formed so as to extend to the surface of the core 30 beyond the range of the conductive resin layer 41 formed in the resin layer forming step.

According to this configuration, it is possible to easily manufacture the inductor 1 capable of effectively preventing peeling between the core 30 and the external electrode 4 under severe conditions in in-vehicle applications and the like.

In the above-described embodiment, the length L, the width W, and the thickness T of the element body 2 have a relationship of L>W>T, and one of the two opposing surfaces having a larger area among the four surfaces other than the end surfaces 14 of the element body 2 is the bottom surface 10 and the other is the upper surface 12. However, the element body 2 has a relationship of T=W, and the four surfaces other than the end surfaces 14 may have the same area. In this case, for convenience, two surfaces among the four surfaces may be defined as the bottom surface 10 and the upper surface 12, and the other two surfaces may be defined as side surfaces. In addition, when T=W, the above-described area ratio Rs in the bottom surface 10, the upper surface 12, and the side surfaces 16 is preferably set to 105% or more and 550% or less (i.e., from 105% to 550%), or 114% or more and 550% or less (i.e., from 114% to 550%) according to the areas of these four surfaces. For example, based on the results of Table 1, Rs applied to the bottom surface 10, the upper surfaces 12, and the side surface 16 is set to 105% or more and 550% or less (i.e., from 105% to 550%) when the area of these four surfaces is 0.3 mm$^2$ or more and less than 0.4 mm$^2$ (i.e., from 0.3 mm$^2$ to 0.4 mm$^2$), and 114% or more and 550% or less (i.e., from 114% to 550%) when the area of these four surfaces is 0.4 mm$^2$ or more, whereby the same effect as the peeling prevention effect of the external electrode 4 in the above-described embodiment can be obtained.

As described above, the inductor 1-3 according to the second embodiment described above includes the core 30 containing magnetic particles and a resin, the coil conductor 20 embedded in the core 30, the conductive resin layer 41 disposed on the surface of the core 30 so as to be in contact with the extended portion 24 which is the end portion of the coil conductor 20 exposed from the core 30, and the plating layer 42-3 formed on the conductive resin layer 41. The plating layer 42-3 is formed so as to extend to the surface of the core 30 beyond the range in which the conductive resin layer 41 is disposed on the surface of the core 30. Furthermore, a part of the outer edge 46 of the plating layer 42-3 extending to the surface of the core 30 forms the recess portion 50 that exposes the surface of the core 30.

According to this configuration, it is possible to effectively prevent peeling between the core 30 of the inductor 1-3 and the external electrode 4-3 and to further improve reliability of the inductor 1-3 under severe conditions in in-vehicle applications and the like. In addition, according to the above configuration, since the position of the edge portion 47 of the conductive resin layer 41 can be known due to the presence of the recess portion 50, it is possible to easily confirm the range of the plating layer 42 extending to the surface of the core 30 and maintain stable manufacturing quality.

Further, in the inductor 1-3, the recess portion 50 is formed at the ridge portion of the core 30 that is a substantially rectangular parallelepiped. According to this configuration, the recess portion 50 can be easily formed on the surface of the core 30.

(Supplement 1)

An inductor including: a core containing magnetic particles and a resin; a conductor embedded in the core; a conductive resin layer disposed on a surface of the core so as to be in contact with an end portion of the conductor exposed from the core; and a plating layer formed on the conductive resin layer, wherein the plating layer is formed so as to extend to the surface of the core beyond a range in which the conductive resin layer is disposed, and a part of an outer edge of the plating layer extending to the surface of the core forms a recess portion exposing the surface of the core.

(Supplement 2)

In the inductor, the recess portion is formed at a ridge portion of the core that is a substantially rectangular parallelepiped.

Note that the above-described embodiments are merely examples of one aspect of the present disclosure, and can be arbitrarily modified and applied without departing from the gist of the present disclosure.

In addition, directions such as horizontal and vertical directions, various numerical values, shapes, and materials in the above-described embodiments include a range (so-called equivalent range) in which the same functions and effects as those of the directions, numerical values, shapes, and materials are exhibited unless otherwise specified.

What is claimed is:

1. An inductor comprising:
   a core containing magnetic particles and a resin;
   a conductor embedded in the core;
   a conductive resin layer disposed on a surface of the core in contact with an end portion of the conductor exposed from the core; and
   a plating layer on the conductive resin layer and extending to the surface of the core beyond an area where the conductive resin layer is disposed, wherein
   the core is a substantially rectangular parallelepiped,
   the conductive resin layer extends on a bottom surface of the core from each of two first end portions of the bottom surface facing each other, the bottom surface of the core defining a substantially rectangular shape, and
   in each of the conductive resin layer extending from each of the first end portions, a ratio of an area of the plating layer to an area of the conductive resin layer on the bottom surface is from 114% to 550%.

2. The inductor according to claim 1, wherein
   a portion of the surface of the core on which the plating layer extends beyond the area of the conductive resin layer has a larger exposed area of the magnetic particles per unit area on the surface of the core than other portions of the surface of the core.

3. The inductor according to claim 1, wherein
   the conductive resin layer extends on a side surface of the core from each of two second end portions of the side surface facing each other, the side surface of the core defining a substantially rectangular shape, and
   in each of the conductive resin layer extending from each of the second end portions, a ratio of an area of the plating layer to an area of the conductive resin layer on the side surface is from 105% to 550%.

4. The inductor according to claim 2, wherein
   the conductive resin layer extends on a side surface of the core from each of two second end portions of the side surface facing each other, the side surface of the core defining a substantially rectangular shape, and
   in each of the conductive resin layer extending from each of the second end portions, a ratio of an area of the plating layer to an area of the conductive resin layer on the side surface is from 105% to 550%.

* * * * *